(12) United States Patent
Inaba

(10) Patent No.: US 9,542,988 B1
(45) Date of Patent: Jan. 10, 2017

(54) SEMICONDUCTOR MEMORY DEVICE

(71) Applicant: KABUSHIKI KAISHA TOSHIBA, Minato-ku, Tokyo (JP)

(72) Inventor: Satoshi Inaba, Seongnam-si (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/065,436

(22) Filed: Mar. 9, 2016

Related U.S. Application Data

(60) Provisional application No. 62/216,227, filed on Sep. 9, 2015.

(51) Int. Cl.
*G11C 11/00* (2006.01)
*G11C 11/16* (2006.01)

(52) U.S. Cl.
CPC .................... *G11C 11/1673* (2013.01)

(58) Field of Classification Search
CPC ...... G11C 11/16; G11C 13/0004; G11C 11/15; G11C 2213/71; G11C 5/02; G11C 11/405; G11C 11/4076; G11C 11/5607; G11C 13/0002; G11C 13/004; G11C 13/0069; G11C 15/02; G11C 15/046; G11C 2211/4016; G11C 2213/72

USPC ................ 365/158, 171, 230.06, 230.03, 63, 100,365/173, 189.011, 51, 189.15, 200, 210.1, 226,365/145
See application file for complete search history.

(56) References Cited

U.S. PATENT DOCUMENTS

2004/0108561 A1* 6/2004 Jeong .................... H01L 27/228
257/422
2010/0054020 A1 3/2010 Ueda
2010/0321980 A1 12/2010 Fujita et al.

FOREIGN PATENT DOCUMENTS

JP 2013125568 A 6/2013

OTHER PUBLICATIONS

S. Kamohara, et al., "Analysis of Extra VT Variability Sources in NMOS Using Takeuchi Plot", 2009 Symposium on VLSI Technology Digest of Technical Papers, pp. 110 and 111.

* cited by examiner

*Primary Examiner* — Thong Q Le
(74) *Attorney, Agent, or Firm* — Holtz, Holtz & Volek PC

(57) ABSTRACT

According to one embodiment, a semiconductor memory device includes a memory cell, a bit line connected to the memory cell, a sense circuit which senses data of the memory cell based on second current that flows through the memory cell and first current, a first transistor of a first conductivity type, which is connected to the bit line and through which the second current flows, and a second transistor of the first conductivity type, through which the first current flows.

20 Claims, 14 Drawing Sheets

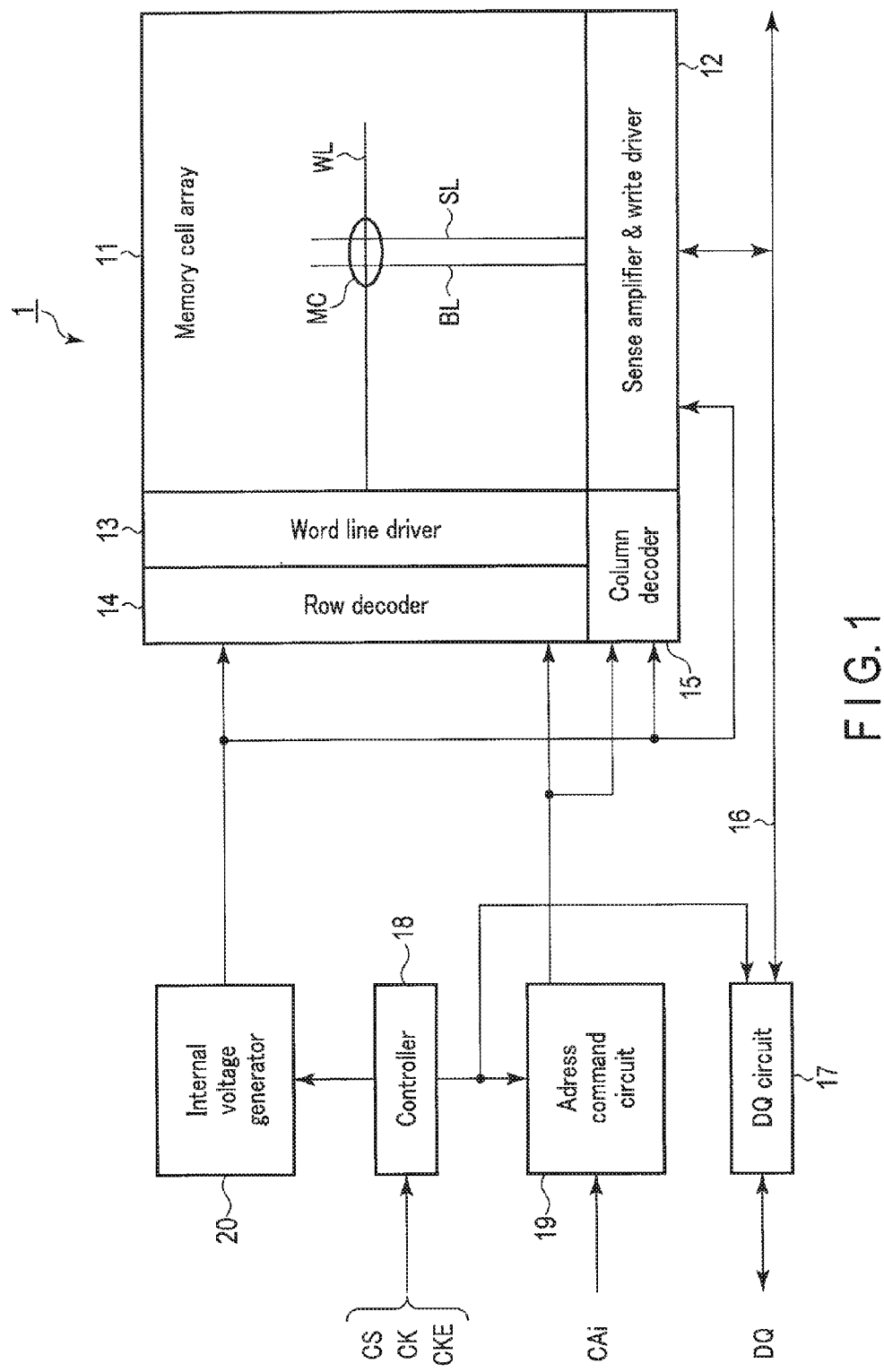
F I G. 1

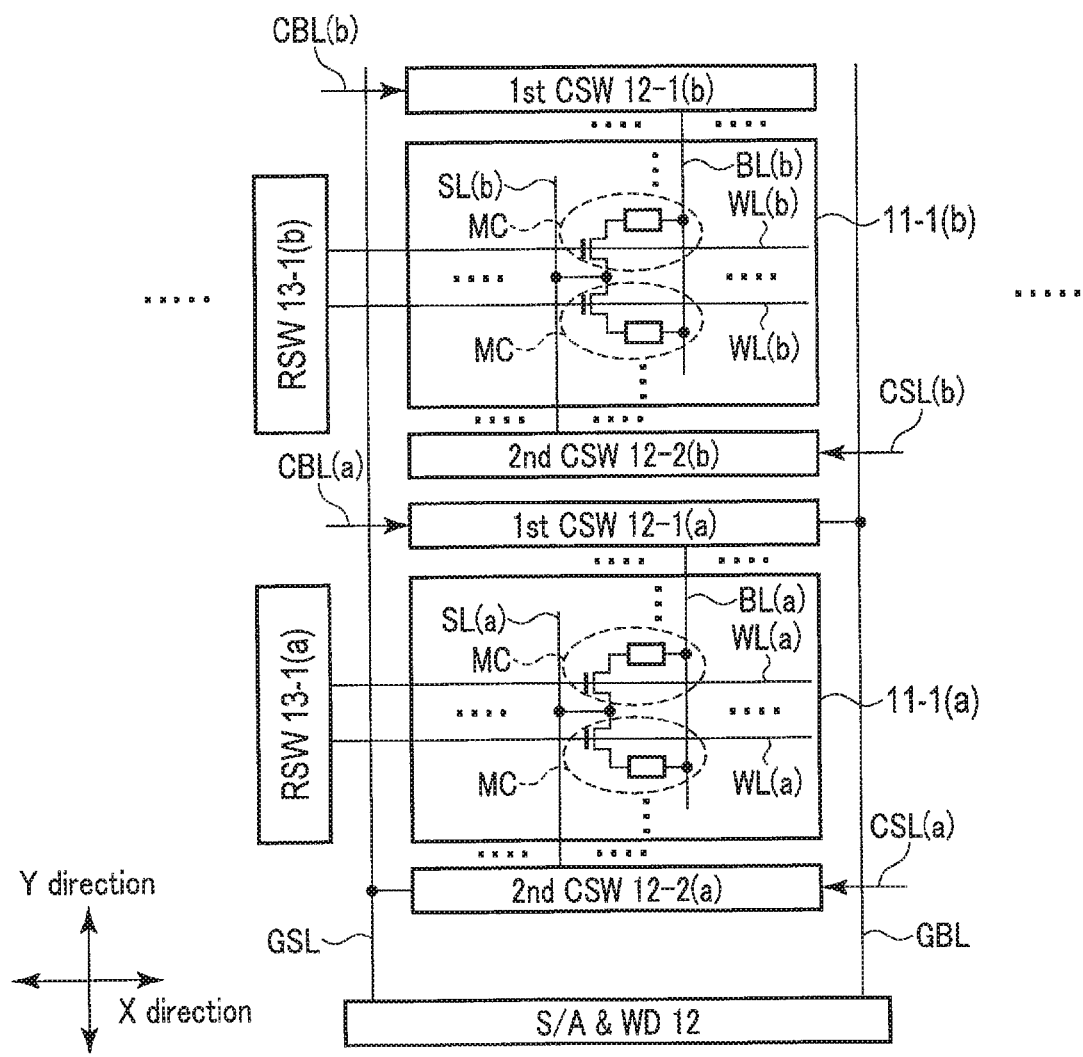
F I G. 4

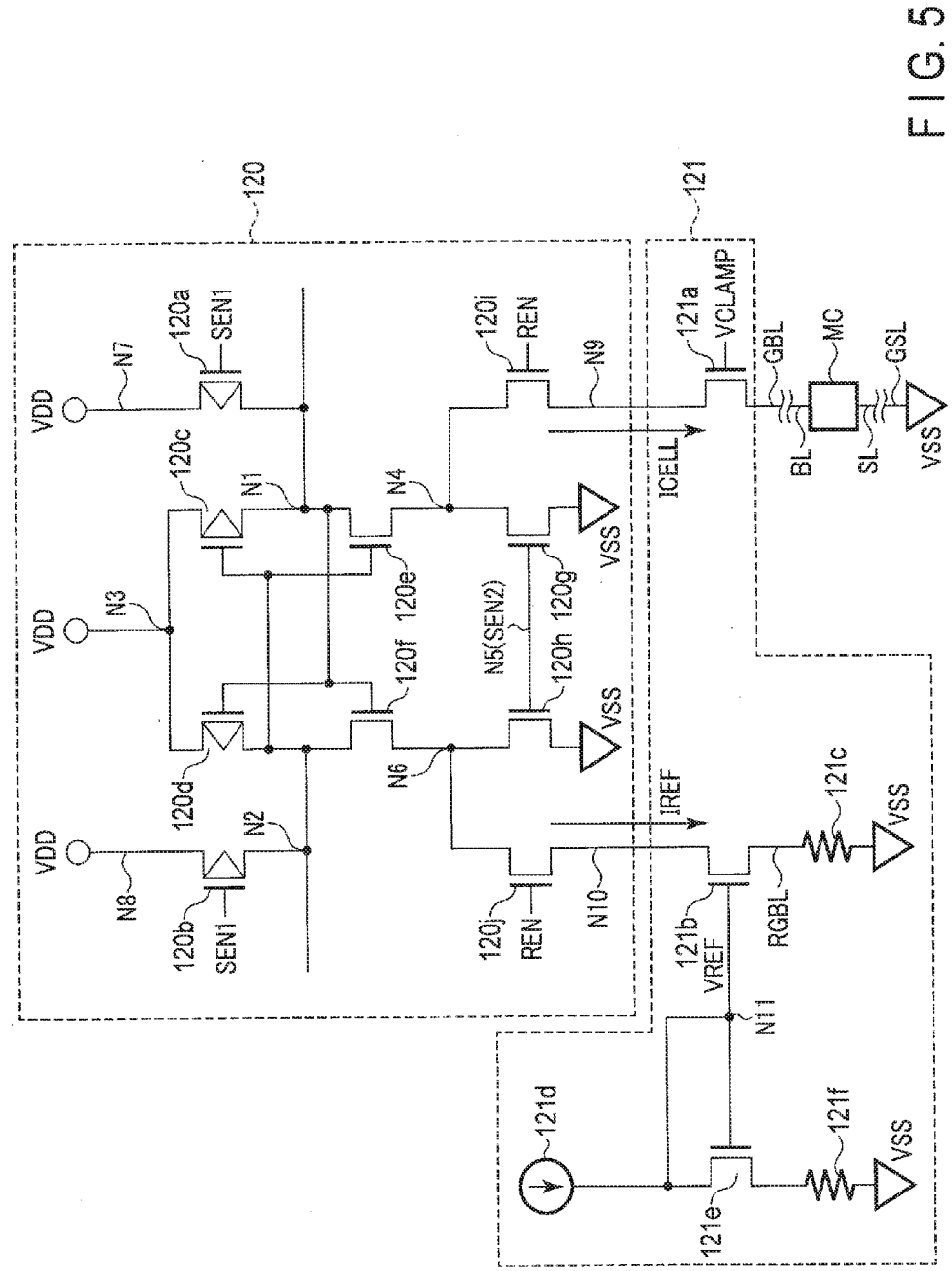
F I G. 5

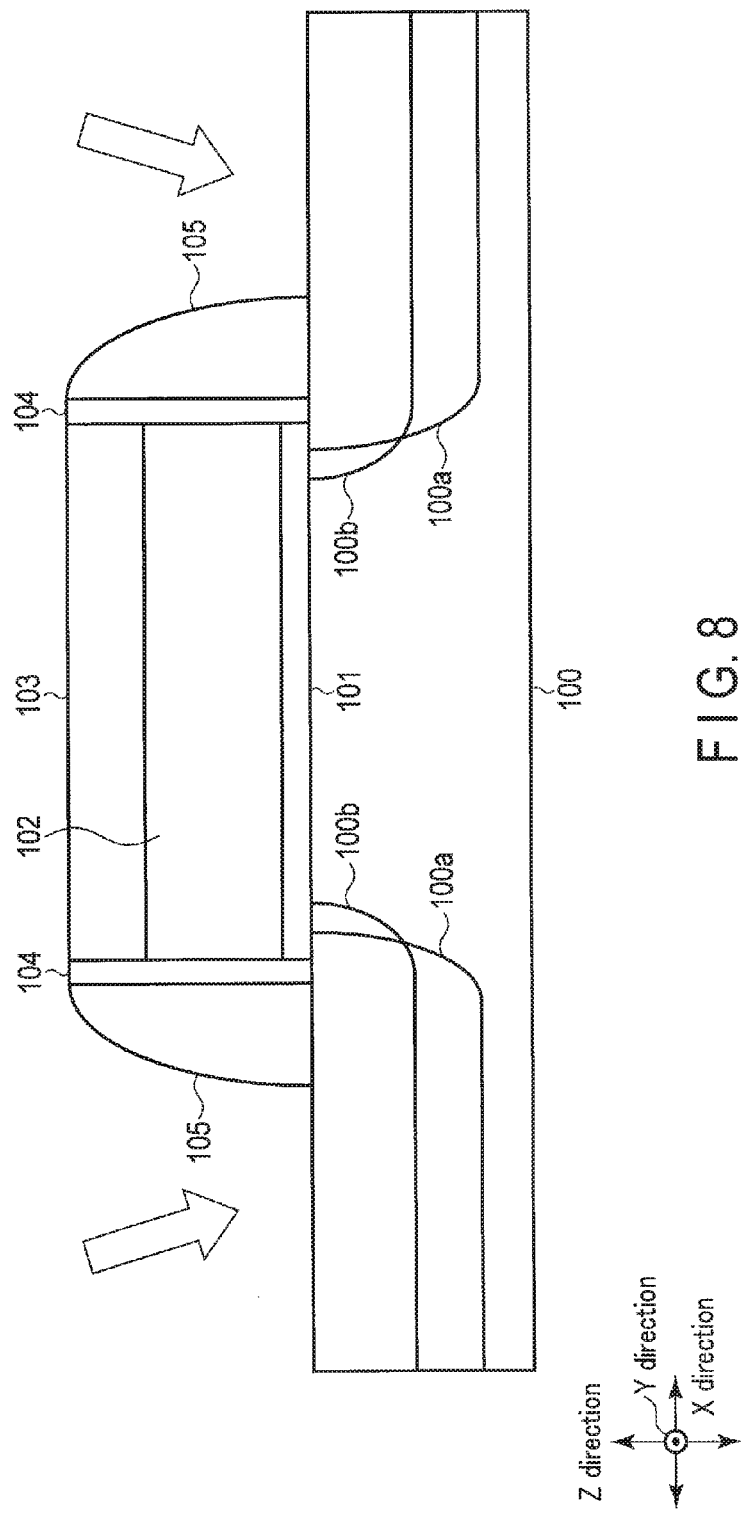
F I G. 8

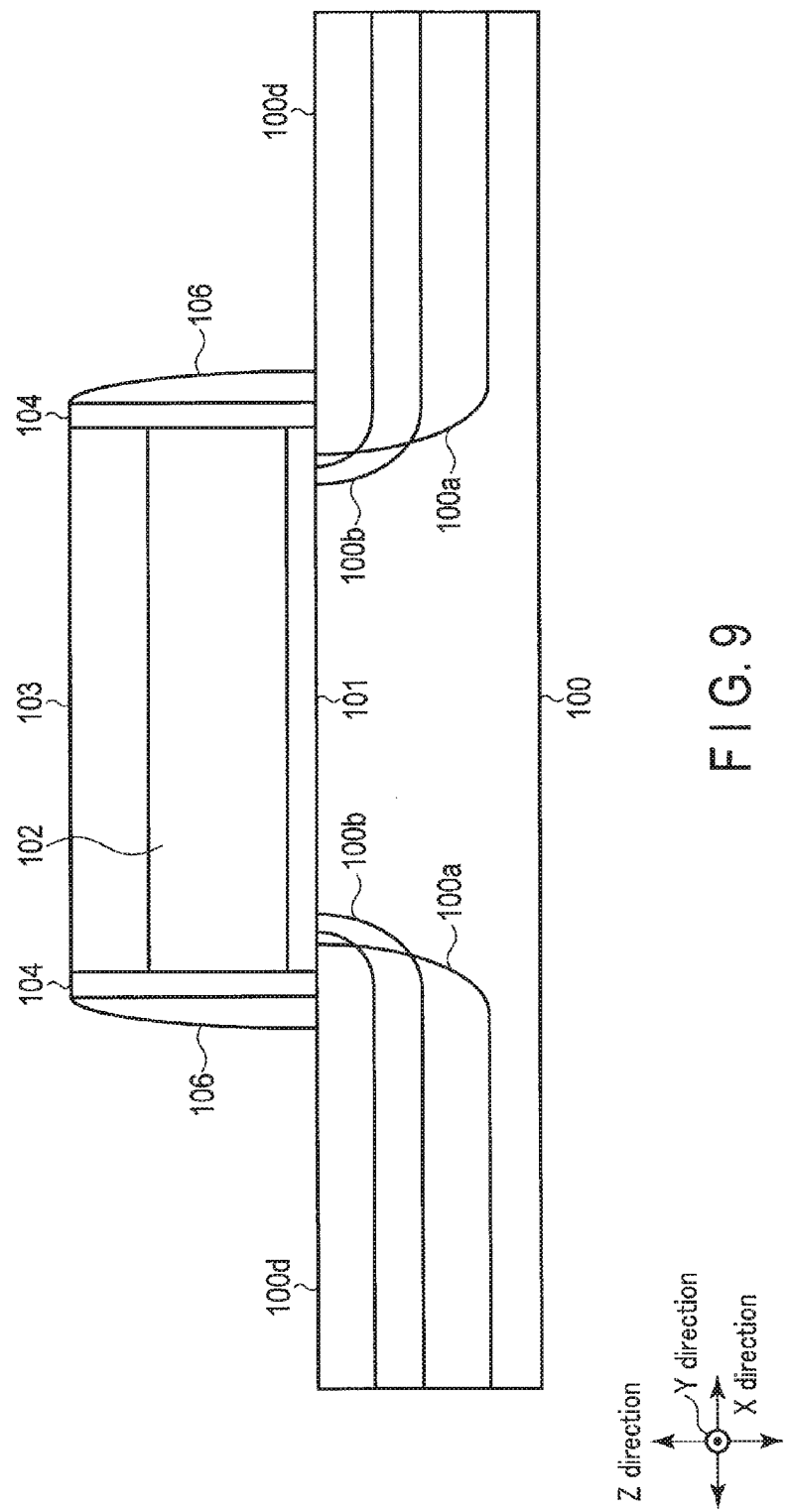
F I G. 9

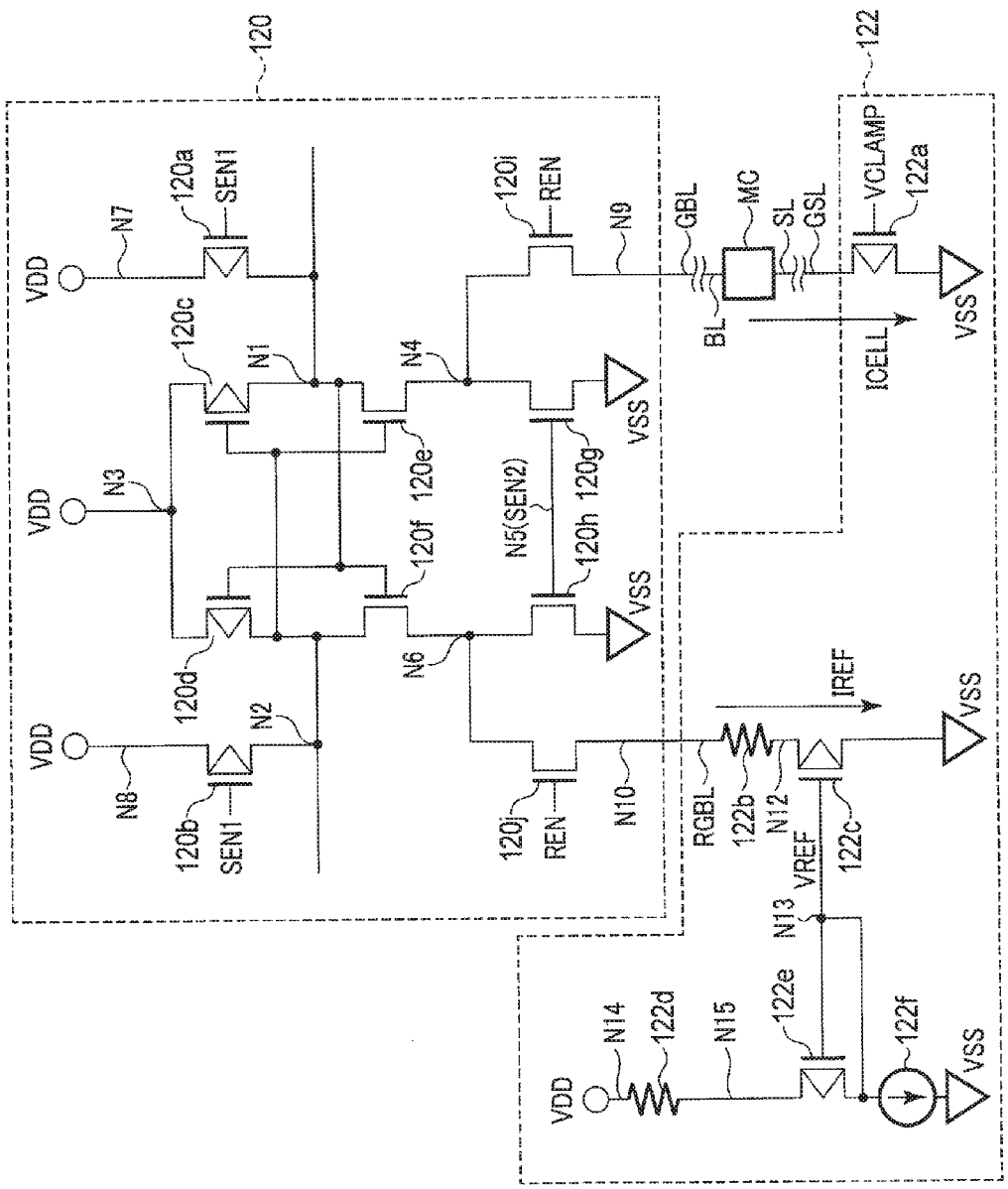
F I G. 11

F.I.G. 12

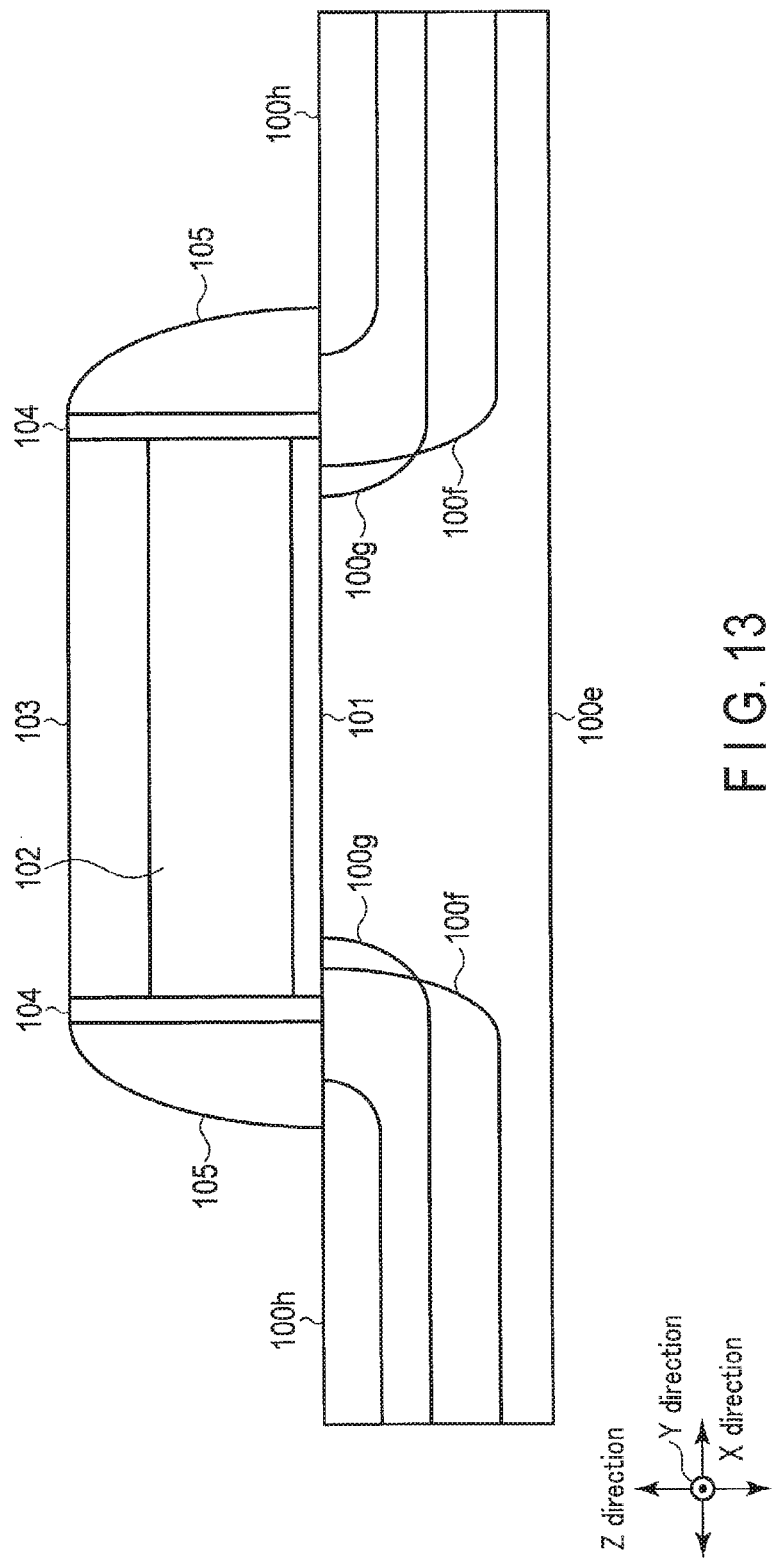
F I G. 13

SEMICONDUCTOR MEMORY DEVICE

CROSS REFERENCE TO RELATED APPLICATIONS

This application claims the benefit of U.S. Provisional Application No. 62/216,227, filed Sep. 9, 2015, the entire contents of which are incorporated herein by reference.

FIELD

Embodiments described herein relate to a semiconductor memory device.

BACKGROUND

A magnetic random access memory (MRAM) is a memory device using a magnetic element having a magnetoresistive effect in memory cells that store information, and it attracts attention as a next-generation memory device that is featured in high-speed operation, large capacity and non-volatility. Research and development has been made to replace the MRAM with a nonvolatile memory such as a DRAM and an SRAM. It is desirable to operate the MRAM in the same manner as the DRAM and SRAM for reducing costs of the development and facilitating the replacement.

BRIEF DESCRIPTION OF THE DRAWINGS

FIG. 1 is a block diagram showing a configuration of a semiconductor memory device according to a first embodiment.

FIG. 4 is a diagram showing a relationship between blocks and their peripheral circuits of the semiconductor memory device according to the first embodiment.

FIG. 5 is a diagram showing a relationship between a sense amplifier and its peripheral circuit of the semiconductor memory device according to the first embodiment.

FIG. 8 is a cross-sectional view showing another step of the method for manufacturing the clamp transistor of the semiconductor memory device according to the first embodiment.

FIG. 9 is a cross-sectional view of a clamp transistor of a semiconductor memory device according to a comparative example of the first embodiment.

FIG. 11 is a diagram showing a relationship between a sense amplifier and its peripheral circuit of a semiconductor memory device according to a third embodiment.

FIG. 13 is a cross-sectional view of the clamp transistor of the semiconductor memory device according to the third embodiment.

DETAILED DESCRIPTION

Figure 2:
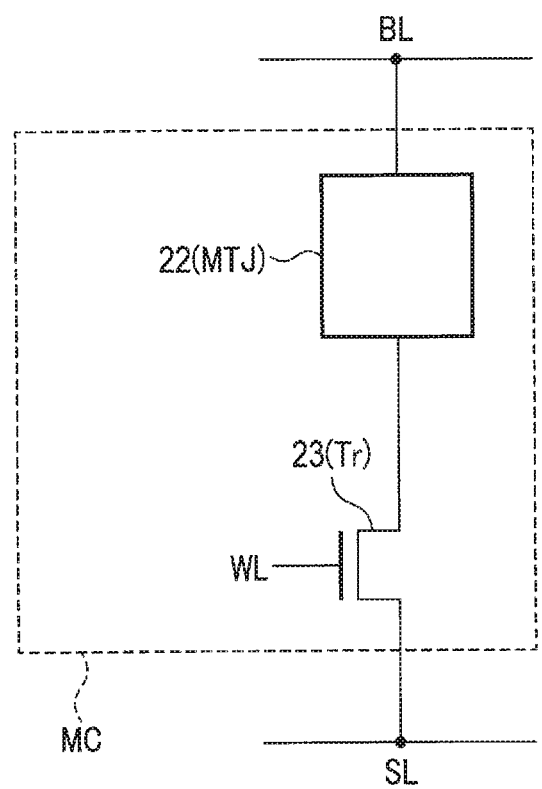
FIG. 2 is a diagram showing a configuration of a memory cell of the semiconductor memory device according to the first embodiment.

In general, according to one embodiment, a semiconductor memory device includes a memory cell, a bit line connected to the memory cell, a sense circuit which senses data of the memory cell based on second current that flows through the memory cell and first current, a first transistor of a first conductivity type, which is connected to the bit line and through which the second current flows, and a second transistor of the first conductivity type, through which the first current flows, wherein the first transistor and the second transistor include a semiconductor substrate, a gate structure provided on the semiconductor substrate, a first conductive region of the first conductivity type provided in the semiconductor substrate inwardly from an end portion of the gate structure, a second conductive region of a second conductivity type different from the first conductivity type, which is provided in the semiconductor substrate more inwardly from the end portion of the gate structure than the first conductive region, and a third conductive region of the first conductivity type provided in the semiconductor substrate and outside the end portion of the gate structure.

Embodiments will be described below with reference to the accompanying drawings. In the following descriptions, the structural elements having substantially the same function and configuration are denoted by the same numeral or sign and their descriptions are omitted when necessary. In the following embodiments, a device and a method for embodying the technical concept of each embodiment are exemplified, and the technical concept does not limit the material, shape, configuration, arrangement, etc. of structural components to the following matters. Various modifications can be made to the technical concept of each of the embodiments within the scope of the claims.

<1> First Embodiment

<1-1> Configuration of Semiconductor Memory Device According to First Embodiment First, a basic configuration of a semiconductor memory device according to a first embodiment will schematically be described with reference to FIG. 1.

A semiconductor memory device 1 according to the first embodiment includes a memory cell array (which is also referred to simply as a cell array) 11, a sense amplifier/write driver 12, a word line driver 13, a row decoder 14, a column decoder 15, a data bus 16, a DQ circuit 17, a controller 18, an address command circuit 19 and an internal voltage generation circuit 20.

The controller 18 is supplied with various external control signals, such as a chip select signal CS, a clock signal CK and a clock enable signal CKE from a host (external) device. The controller 18 controls the address command circuit 19 to distinguish between an address and a command.

The internal voltage generation circuit 20 is provided to generate an internal voltage (e.g., a voltage boosted by a power supply voltage) necessary for each operation in the semiconductor memory device 1. This internal voltage generation circuit 20 is also controlled by the controller 18 to generate a voltage necessary for performing a boost operation.

The address command circuit 19 is supplied with a command address signal CAi from the host (external) device. The address command circuit 19 transfers the command address signal CAi to the row decoder 14 and column decoder 15.

The memory cell array 11 is an MRAM in which a plurality memory cells MC are two-dimensionally arranged in matrix. Each of the memory cells MC includes an MTJ element 22 (not shown) and a cell transistor 23 (not shown). The MTJ element 22 is a magnetic tunnel junction element capable of storing data according to variations in resistive state and rewriting data by current. The cell transistor 23 is provided to correspond to the MTJ element 22 and configured to be in conduction state when current is caused to flow through the corresponding MTJ element 22.

A plurality of word lines WL are arranged in row direction and a plurality of bit lines BL are arranged in column direction, and these lines WL and BL cross each other. Adjacent two of the bit lines BL are paired up, and the memory cells MC are provided at their corresponding nodes between the word lines WL and the paired bit lines (referred to as bit lines BL and source lines SL for convenience sake in this embodiment). The MTJ element 22 and cell transistor 23 of each of the memory cells MC are connected in series between the bit line BL and source line SL (between the paired bit lines). The gate of the cell transistor 23 is connected to the word line WL.

The word line driver 13 is provided along at least one side of the memory cell array 11. The word line driver 13 is connected to the word line WL via a main word line MWL and configured to apply a voltage to a selected main word line MWL when data is read out or written in.

The row decoder 14 decodes an address of the command address signal CAi supplied from the address command circuit 19. More specifically, the row decoder 14 supplies the decoded row address to the word line driver 13. Accordingly, the word line driver 13 is able to apply a voltage to the selected main word line MWL.

On the basis of an external control signal, the column decoder 15 recognizes a command or an address by the command address signal CAi to control selection of a bit line BL and a source line SL.

The sense amplifier/write driver 12 includes a sense amplifier and a write driver. The sense amplifier/write driver 12 is provided along at least one side of the memory cell array 11. The sense amplifier is connected to the bit lines BL via a global bit line GBL, and current that flows through a memory cell MC connected to the selected word line WL is detected to read data out of the memory cell. The write driver is connected to the bit line BL via the global bit line GBL or connected to the source line SL via a global source line GSL, and current is caused to flow through the memory cell MC connected to the selected word line WL, with the result that data is written.

The sense amplifier/write driver 12 includes a page buffer which is not shown. The page buffer holds data read out by the sense amplifier or data received via the data bus 16 and DQ circuit 17.

The transfer of data between the sense amplifier/write driver 12 and an external input/output terminal DQ is performed via the data bus 16 and DQ circuit 17.

<1-2> Configuration of Memory Cell MC

Next, one example of the configuration of a memory cell MC according to the first embodiment will schematically be described with reference to FIG. 2. As shown in FIG. 2, one end of the MTJ element 22 of the memory cell MC according to the first embodiment is connected to the bit line BL, and the other end thereof is connected to one end of a cell transistor 23. The other end of the cell transistor 23 is connected to the source line SL. The MTJ element 22 employing tunneling magnetoresistive (TMR) effect stores digital data according to variations in magnetic resistance due to spin polarization tunneling effect. The MTJ element 22 can be rendered in both a low-resistance state and a high-resistance state by magnetization orientation. If, for example, the low-resistance state is defined as data "0" and the high-resistance state is defined as data "1," one-bit data can be recorded on the MTJ element 22. Naturally, the low-resistance state can be defined as data "1" and the high-resistance state can be defined as data "0."

<1-3> Configuration of Memory Cell Array

Figure 3:
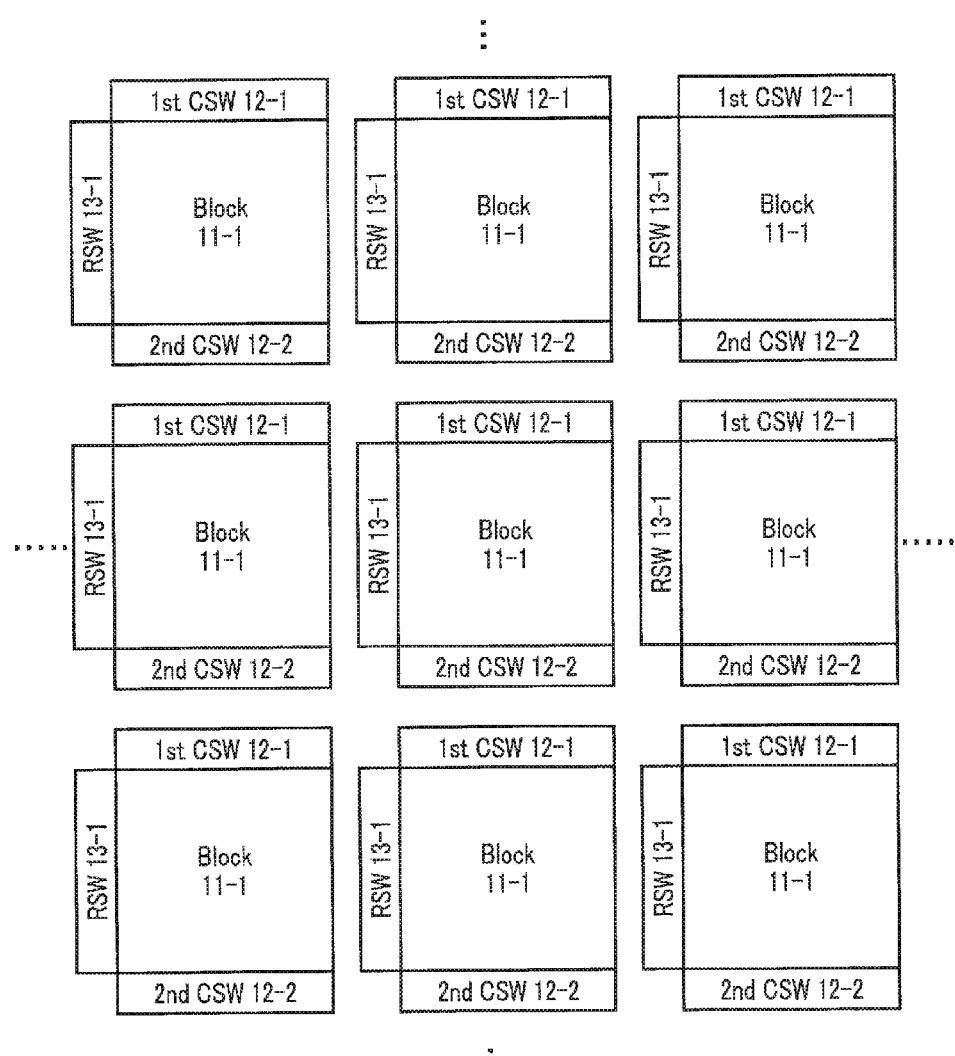
FIG. 3 is a diagram showing a configuration of a memory cell array of the semiconductor memory device according to the first embodiment.

The memory cell array 11 according to the embodiment will be described with reference to FIG. 3.

The memory cell array 11 according to the present embodiment is divided into a plurality of blocks 11-1. Each of the blocks 11-1 includes a plurality of memory cells MC. The blocks 11-1 are arranged in matrix in an X direction and a Y direction (which is perpendicular to the X direction). The main word line MWL (not shown) extends along the X direction, and the global bit line GBL (not shown) and global source line GSL (not shown) extend along the Y direction.

A row selection circuit 13-1 is provided along one end of each of the blocks 11-1 in the Y direction. The row selection circuit 13-1 is used to control the block 11-1. Specifically, the row selection circuit 13-1 selects a word line WL connected to the main word line MWL in response to a signal from the row decoder 14.

A first column selection circuit 12-1 and a second column selection circuit 12-2 are provided along their respective ends of each of the blocks 11-1 in the X direction. The first column selection circuit 12-1 controls a connection between the global bit line GBL and bit line BL. The second column selection circuit 12-2 controls a connection between the global source line GSL and source line SL.

<1-4> Relationship Between First and Second Column Selection Circuits 12-1 and 12-2 and Block 11-1

A specific example of the first to fourth column selection circuits 12-1 to 12-4 and blocks 11-1 will be described with reference to FIG. 4.

Referring to FIG. 4, a block 11-1 (*a*) and a block 11-1 (*b*) and their related first column selection circuit 12-1 and second column selection circuit 12-2 will be described.

In the figure, the structural elements labeled "(x)" (x: any alphabet) are related to the block 11-1 (*x*). For brevity, the structural elements may not be labeled "(x)" in this specification.

The first column selection circuit 12-1 includes a plurality of switch transistors and controls a connection between the global bit line GBL and bit line BL on the basis of a control signal CBL from the column decoder 15.

The second column selection circuit 12-2 includes a plurality of switch transistors and controls a connection between the global source line GSL and source line SL on the basis of a control signal CSL from the column decoder 15.

In FIG. 4, for example, a second column selection circuit 12-2 (a), a block 11-1 (a), and a first column selection circuit 12-1 (a) are arranged toward the Y direction from the sense amplifier/write driver 12. However, the first column selection circuit 12-1 and the second column selection circuit 12-2 can be changed in location to each other. Specifically, for example, the first column selection circuit 12-1 (a), block 11-1 (a) and second column selection circuit 12-2 (a) can be arranged in this order toward the Y direction from the sense amplifier/write driver 12.

<1-5> Configuration of Sense Amplifier

One example of the sense amplifier according to the present embodiment will be described with reference to FIG. 5. Of the sense amplifier/write driver 12, only the sense amplifier will be described below.

The sense amplifier includes a reference circuit and also includes a converter 121 for converting a resistance value of the memory cell MC and that of the reference circuit into two current values and an amplifier (which is also called a sense circuit) 120 for comparing the converted two current values and amplifying them.

The amplifier 120 includes PMOS transistors 120a, 120b, 120c and 120d and NMOS transistors 120e, 120f, 120g, 120h, 120i and 120j. The converter 121 includes NMOS transistors 121a, 121b and 121e, reference circuits 121c and 121f and a constant-current source 121d.

<1-5-1> Specific Circuit Arrangement of Amplifier

Next, the amplifier 120 will be described. The source of the PMOS transistor 120a is connected to a node N7 to which a power supply voltage "VDD" is applied, the drain thereof is connected to a node N1, and the gate thereof is supplied with a signal "SEN1." The source of the PMOS transistor 120b is connected to a node N8 to which a power supply voltage "VDD" is applied, the drain thereof is connected to a node N2, and the gate thereof is supplied with a signal "SEN1." The source of the PMOS transistor 120c is connected to a node N3 to which a power supply voltage "VDD" is applied, the drain thereof is connected to a node N1, and the gate thereof is connected to the node N2. The source of the PMOS transistor 120d is connected to the node N3, the drain thereof is connected to the node N2, and the gate thereof is connected to the node N1. The drain of the NMOS transistor 120e is connected to the node N1, the source thereof is connected to a node N4 and the gate thereof is connected to the node N2. The drain of the NMOS transistor 120f is connected to the node N2, the source thereof is connected to a node N6 and the gate thereof is connected to the node N1. The drain of the NMOS transistor 120g is connected to the node N4, the source thereof is grounded and the gate thereof is connected to a node N5 which is supplied with a signal "SEN2." The drain of the NMOS transistor 120h is connected to the node N6, the source thereof is grounded and the gate thereof is connected to the node N5. The drain of the NMOS transistor 121i (read enable transistor) is connected to the node N4, the source thereof is connected to a node 9 and the gate thereof is supplied with a signal "REN." The drain of the NMOS transistor 121j (read enable transistor) is connected to the node N6, the source thereof is connected to a node 10 and the gate thereof is supplied with a signal "REN."

The amplifier 120 compares cell current ICELL that flows toward the memory cell MC and reference current IREF that flows toward the reference circuit to sense whether data is "0" or "1." The node N1 outputs a signal "SO" to a page buffer which is not shown. The node N2 outputs a signal "bSO" to a page buffer which is not shown.

<1-5-2> Specific Circuit Arrangement of Clamp Unit

The converter 121 will be described. The drain of the NMOS transistor 121a (clamp transistor) is connected to a node N9, the source thereof is connected to the global bit line GBL and the gate thereof is supplied with a clamp signal "VCLAMP." As shown in FIG. 5, the converter 121 is connected to the memory cell MC via the global bit line GBL. The NMOS transistor 121a serves as a transistor through which cell current flows.

The drain of the NMOS transistor 121b (clamp transistor) is connected to a node N10, the source thereof is connected to a reference global bit line RGBL and the gate thereof is connected to a node N11 connected to the constant-current source 121d. The NMOS transistor 121b is connected to the reference circuit 121c via the reference global bit line RGBL. The reference circuit 121c includes, for example, a resistive element. The reference circuit 121c is not limited to the resistive element.

The drain and gate of the NMOS transistor 121e are connected to the node N11 and the source thereof is connected to the reference circuit 121f. The reference circuit 121f includes, for example, a resistive element. The reference circuit 121f is not limited to the resistive element. The other ends of the reference circuits 121c and 121f are each grounded. The NMOS transistors 121b and 121e and the constant-current source 121d constitute a current mirror circuit.

In the converter 121, a reference voltage (VREF) is generated from a constant-voltage source including a constant-current source, a transistor and a resistive element and applied to the gate of the NMOS transistor 121b. It is thus possible to generate a reference current IREF having a fixed value. The NMOS transistor 121b serves as a transistor through which reference current flows.

<1-6> Clamp Transistor

<1-6-1> Configuration of Clamp Transistor

The configuration of the NMOS transistors 121a, 121b and 121e (clamp transistor) will be described with reference to FIG. 6.

Figure 6:
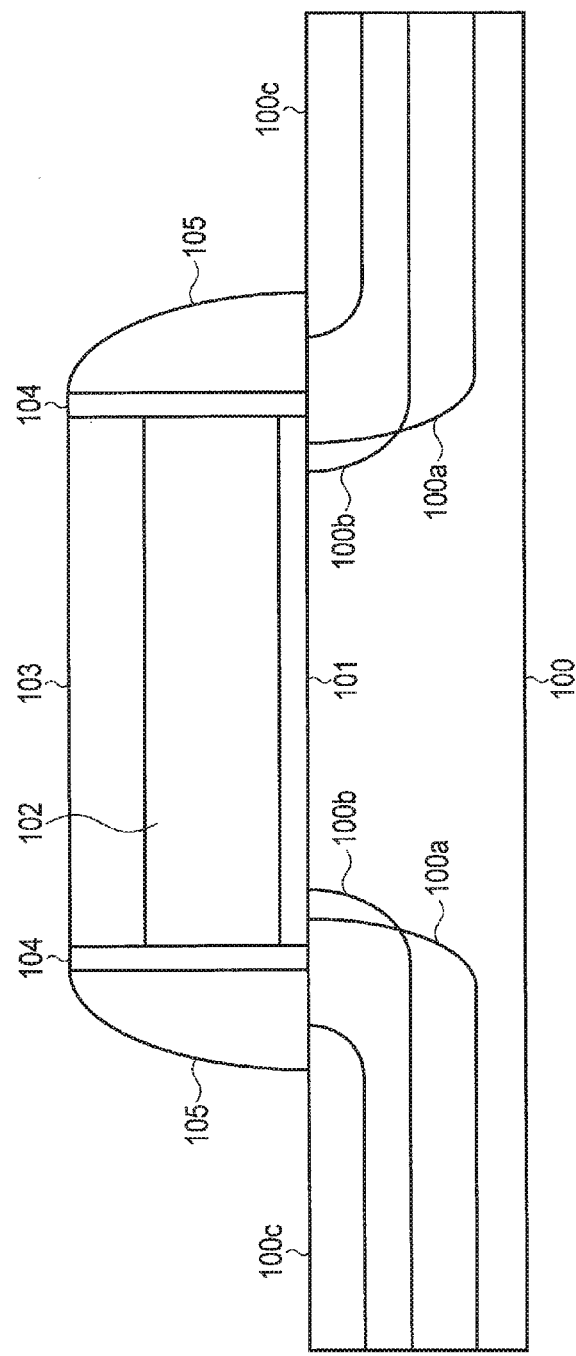
FIG. 6 is a cross-sectional view of a clamp transistor of the semiconductor memory device according to the first embodiment.

As shown in FIG. 6, in the clamp transistor, an n-type impurity diffusion region 100a (e.g., arsenic (As), 1E13 to 1E14 [1/cm$^2$], 50-100 [KeV]) which has medium impurity concentration and a deep junction is provided in the surface region of a p-type semiconductor substrate 100. A p-type impurity diffusion region 100b (e.g., boron (B), 1E13 [1/cm$^2$], 5-15 [KeV]) is provided in the impurity diffusion region 100a of the semiconductor substrate 100. Further, an n-type impurity diffusion region 100c (e.g., As, 2E15 [1/cm$^2$], 5-10 [KeV]) which has a high impurity concentration and shallow junction depth is provided in the surface region of the impurity diffusion region 100a of the semiconductor substrate 100. The impurity diffusion region 100a and impurity diffusion region 100c serve as a source or a drain of the clamp transistor.

Though not shown, a contact plug to be connected to other wiring is provided on the semiconductor substrate and on the impurity diffusion region 100c.

The impurity diffusion region 100a can be referred to as a source/drain (S/D) region of a lightly doped drain (LDD) type. The impurity diffusion region 100b can be referred to as a halo region. The impurity diffusion region 100c can be referred to as an S/D region. The impurity diffusion region 100b and each of the impurity diffusion regions 100a and 100c have only to be formed of impurities of conductivity types opposite to each other. The impurity diffusion regions can be referred to as conductive regions.

A gate insulation layer 101 (for example, $SiO_2$ or SiON) is provided on the semiconductor substrate 100 and above a channel region interposed between the impurity diffusion regions 100a in the X direction. A control gate electrode layer 102 (for example, polysilicon or metal) is provided on the gate insulation layer 101. A cap layer 103 (for example, SiN) is provided on the control gate electrode layer 102. The gate insulation layer 101, control gate electrode layer 102 and cap layer 103 can also be referred to as a gate structure. The length of the gate structure (length along the X direction) is, for example, about 0.3 to 0.5 μm.

A sidewall film 104 (formed of, e.g., SiN) whose thickness (thickness along the X direction) is about 50 to 100 Angstrom is provided on either sidewall of the gate structure in the Y direction (which is perpendicular to the X direction). A sidewall film 105 (formed of, e.g., $SiO_2$) whose thickness (thickness along the X direction) is about 300 to 600 Angstrom is provided on either sidewall of the sidewall film 104 along the Y direction.

The impurity diffusion region 100b extends off the impurity diffusion region 100a toward the direction of the center of the channel region. The impurity diffusion region 100a and impurity diffusion region 100b are partly located in the lower part of the gate structure. The impurity diffusion region 100c is not located at least in the lower part of the gate structure. For example, the impurity diffusion region 100c is provided below the sidewall film 105, or the impurity diffusion region 100b is located inwardly from an end portion of the gate structure, and the impurity diffusion region 100c is located outwardly from the end portion of the gate structure.

In other words, the end portion of the impurity diffusion region 100c is offset from that of the impurity diffusion region 100a, or the end portion of the impurity diffusion region 100c is fully separated from that of the impurity diffusion region 100b.

<1-6-2> Method for Manufacturing Clamp Transistor

A method for manufacturing a clamp transistor will be described.

Figure 7:
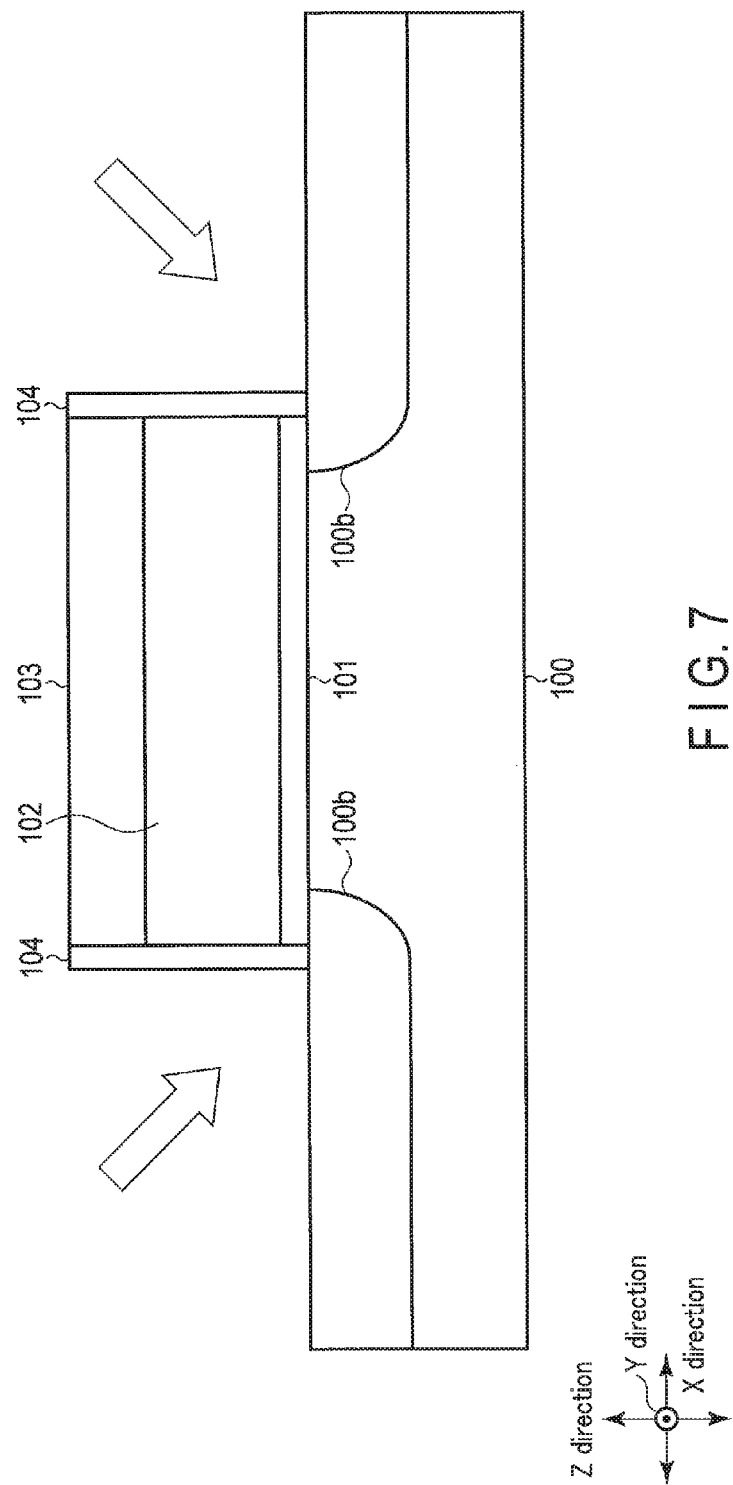
FIG. 7 is a cross-sectional view showing a step of a method for manufacturing the clamp transistor of the semiconductor memory device according to the first embodiment.

As shown in FIG. 7, first, a gate structure is formed on the semiconductor substrate 100. Then, a sidewall film 104 whose thickness is about 50 to 100 Angstrom is formed on either sidewall of the gate structure along the Y direction and on the surface area of the semiconductor substrate 100. After the sidewall film 104 is formed, boron (B) is obliquely ion-implanted under the conditions of, e.g., 1E13 [$1/cm^2$] and 5-15 [KeV] thereby to form an impurity diffusion region 100b.

Next, as shown in FIG. 8, a sidewall film 105 whose thickness is about 300 to 600 Angstrom is formed on the sidewall of each sidewall film 104 along the Y direction.

After that, arsenic (As) is ion-implanted under the conditions of, e.g., 1E13 to 1E14 [$1/cm^2$] and 50-100 [KeV], with the result that an impurity diffusion region 100a is formed in the surface region of the semiconductor substrate 100. This impurity diffusion region 100a is a region in which impurities are diffused more deeply than the impurity diffusion region 100b.

After that, the resultant structure is temporarily annealed at, e.g., 900° C. or lower by rapid thermal anneal (RTA), laser anneal, flash lamp anneal or the like.

Next, as shown in FIG. 6, arsenic (As) ions are implanted under the conditions of, e.g., 2E15 [$1/cm^2$] and 5-10 [KeV], with the result that an impurity diffusion region 100c is formed in the surface region of the semiconductor substrate 100. This impurity diffusion region 100c is formed more shallowly at a higher concentration than the impurity diffusion region 100a. Subsequently, in order to activate the impurities, the resultant structure is annealed at a high temperature for a very short time (e.g., spike anneal, laser anneal and flash lamp anneal at a temperature of 1000° C. or higher), thus completing a clamp transistor.

After the sidewall film 105 whose thickness is large (thickness in the X direction) is formed, the impurity diffusion region 100c is formed. The impurity diffusion region 100c can thus be formed away from the end portion of the impurity diffusion region 100b.

<1-7> Operational Advantages

According to the foregoing embodiment, the impurity diffusion region 100a is formed in the surface region of the semiconductor substrate of the clamp transistor, the impurity diffusion region 100b is formed therein closer to a channel region than the impurity diffusion region 100a, and the impurity diffusion region 100c is formed therein more distant from the channel region than the impurity diffusion region 100b. It is thus possible to inhibit variations in threshold voltage $V_T$ of the clamp transistor.

It is considered that a sense amplifier used in a resistance change type memory performs a current read operation.

The sense amplifier compares cell current and reference current and determines whether data is "0" or "1."

When the transistors of the sense amplifier vary in threshold voltage $V_T$, it is likely that an error (noise) will be caused on a signal to be read out. If variations in reference current are particularly noted, it is considered that the variations are caused by variations in threshold voltage $V_T$ of the clamp transistor connected to the reference circuit.

The clamp transistor of the foregoing sense amplifier has a relatively large gate length (compared with the minimum dimensions determined by a design rule), and the application of a substrate bias voltage increases an electric field between a control gate electrode and a drain and an electric field between a control gate electrode and a semiconductor substrate. Thus, a structure to suppress the leakage current is required. In the clamp transistor of the sense amplifier, an device structure to decrease an influence of variations in characteristics, gate length and the like is also required.

In a comparative example of the clamp transistor as shown in FIG. 9, an end portion of an impurity diffusion region 100d which is shallow and has a relatively high impurity concentration is close to that of an impurity diffusion region 100b. Consequently, an electric field is increased at a portion where the end portions are close to each other; thus, it is likely that junction leakage current will increase and gate induced drain leakage (GIDL) will increase.

Furthermore, it is likely that ion implantation damage caused when the high-concentration impurity diffusion region 100d is formed and its subsequent thermal process will cause re-distribution (which is also described as TED: Transient Enhanced Diffusion) of boron (B) into the impurity diffusion region 100b through Si interstitial generated as substrate damage at the time of ion implantation. As a result, variations in threshold voltage $V_T$ of the clamp transistor will increase due to variation in the locations and amount of boron ionized close to the channel region. Since the end portion of the impurity diffusion region 100d is close to that of the impurity diffusion region 100b, it is likely that the impurity diffusion region 100b will be re-diffused.

In the present invention, however, the impurity diffusion region 100b containing boron is close to the impurity diffusion region 100a that is formed of medium-concentration arsenic (As) and not close to the relatively high concentration impurity diffusion region 100c. Thus, even though a substrate bias is applied, GIDL and junction leakage current caused when a drain voltage is applied, can be decreased more than in the prior art structure.

The impurity diffusion region 100b and the impurity diffusion region 100c are not close to each other. Thus, an overlap between the impurity diffusion region 100b and the diffusion of a large amount of Si interstitial generated by ion implantation when the impurity diffusion region 100c is formed, is decreased more than in the comparative example. It is thus possible to decrease the re-diffusion of boron in the impurity diffusion region 100b at the time of annealing after the impurity diffusion region 100c is formed.

Since the impurity diffusion region 100c is fully separated from the edge of the gate structure, an influence of drain induced barrier lowering (DIBL) can be lessened, too. It is thus possible to achieve a clamp transistor which is decreased in variations even though the gate length is decreased more than in the comparative example.

Therefore, the clamp transistor according to the foregoing embodiment is capable of decreasing variations in threshold voltage $V_T$.

<2> Second Embodiment

A second embodiment will be described next. In the second embodiment, a read operation will be described. The basic configuration and basic operation of a storage device according to the second embodiment are the same as those of the storage device according to the first embodiment described above. Therefore, a description of the foregoing matters of the first embodiment is omitted, as is a description of matters that can easily be inferred from the first embodiment described above.

<2-1> Read Operation

Figure 10:
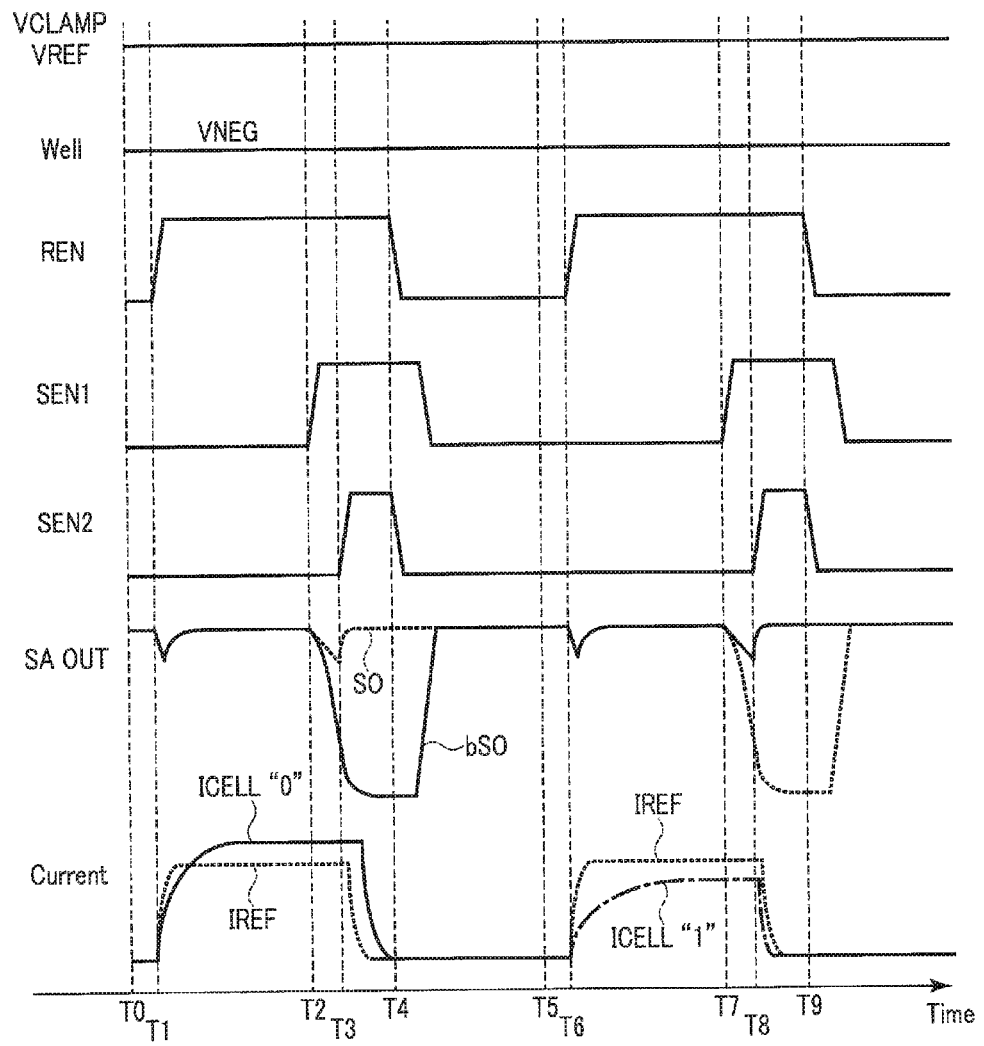
FIG. 10 is a waveform chart showing a read operation of a semiconductor memory device according to a second embodiment.

A basic read operation of the semiconductor memory device according to the present embodiment will be described with reference to FIG. 10. FIG. 10 shows a case where "0" data is read during a period from time T0 to time T5 and a case where "1" data is read during a period on and after time T6. In the following read operation, a controller 18 controls each signal.

[Time T0]

At time T0, the controller 18 sets each of signals "REN," "SEN1" and "SEN2" at a low (L) level and sets a signal "VCLAMP" at a high (H) level. The controller 18 also applies a negative voltage "VNEG" to a semiconductor substrate (WELL) of NMOS transistors 121a, 121b and 121e. The voltage to be applied to the semiconductor substrate is also referred to as a substrate bias voltage or the like.

Here, the "L" level represents a voltage which renders an NMOS transistor in an off-state and renders a PMOS transistor in an on-state. The "H" level represents a voltage which renders a PMOS transistor in an off-state and renders an NMOS transistor in an on-state. The on-state is a state in which the source and drain of a transistor are electrically connected by the channel of the transistor. The off-state is a state in which the source and drain of a transistor are not electrically connected. In the off-state, too, for example, leakage current may flow between the source and drain and this case is treated as not an on-state but an off-state.

The controller 18 operates a constant-current source 121d, and the constant-current source 121d applies a voltage "VREF" to render the NMOS transistor 121b in an on-state.

[Time T1]

At time T1, the controller 18 raises the level of signal "REN" to "H" level from "L" level. Accordingly, cell current "Icell" flows from an amplifier unit to a memory cell MC. Reference current "Iref" flows from an amplifier to a reference circuit 121c.

[Time T2]

At time T2 when it is assumed that a difference between the cell current "Icell" and reference current "Iref" is caused to such a degree that the amplifier unit can sense, the controller 18 raises the level of signal "SEN1" to "H" level from "L" level.

Thus, the PMOS transistor of the amplifier unit is turned off. Accordingly, charges are drawn out of a node N1 by the cell current "Icell" and charges are drawn out of a node N2 by the reference current "Iref." At this time, a difference between signals "bSO" and "SO" is amplified by an amplifier 120.

When data stored in the memory cell MC is "0" data, the resistance becomes low and the cell current "Icell" becomes larger than the reference current "Iref." At time T2, therefore, a larger number of charges are drawn out of the node N1 than the node N2. Consequently, the PMOS transistor is turned on, the NMOS transistor is turned off, and a voltage is applied to the node N2 via a node N3. Accordingly, the node N2 becomes an "H" level, the PMOS transistor is turned off and the NMOS transistor is turned on.

[Time T3]

At time T3, the controller 18 raises the level of the signal "SEN2" to "H" level from "L" level.

Thus, NMOS transistors 120g and 120h are turned on and nodes N4 and N6 are set at a ground potential. As described above, an NMOS transistor 120e is turned on and an NMOS transistor 120f is turned off. The node N1 is therefore connected to a ground potential, and charges are drawn. Thus, the signals "bSO" and "SO" amplified based on data are latched in a page buffer not shown.

[Time T4 and Time T5]

During a period from time T4 to time T5, the controller 18 lowers the level of each of signals "REN," "SEN1" and "SEN2" to "L" level from "H" level. Thus, the nodes N1 and N2 start to be charged.

[Time T6 to Time T9]

The operation of the controller 18 during a period from time T6 to time T9 is the same as that during a period from time T1 to time T4 described above and thus its description is omitted.

<2-2> Operational Advantages

According to the foregoing embodiment, in the sense amplifier of the semiconductor memory device according to the present embodiment, a negative voltage "VNEG" is applied to the semiconductor substrate (WELL) of the NMOS transistors 121a, 121b and 121e in read operation. It is thus possible to inhibit variations in threshold voltage $V_T$ of the clamp transistor.

A relationship between variations in threshold voltage $V_T$ of the clamp transistor (FIG. 9) of the comparative example and the substrate bias voltage will be described with reference to T. Tsunomura et al.: Symp. on VLSI Tech. 2009, 6A-1, pp. 110-111, (2009) (non-patent document 1). Non-patent document 1 discloses that variations in threshold voltage of a transistor are changed and reduced by application of substrate bias.

$V_{BS}$ represents a substrate bias voltage and $B_{VT}$ represents a slope of the graph (an index of variations in threshold voltage $V_T$ of the transistor) shown in FIG. 16 of non-patent document 1. $T_{INV}$ represents the size of a gate insulation layer, $V_T$ represents a threshold voltage and $V_0$ represents a predetermined value. L represents a gate length (length along the X direction) of the transistor and W represents a gate width (length along the Y direction) of the transistor. The smaller $B_{VT}$ means the smaller the variations.

There is a case where the variations in threshold voltage $V_T$ of the transistor appear different according to whether a substrate bias is present or not. As illustrated in FIGS. 16 and 17 of non-patent document 1, the variations in threshold voltage $V_T$ are decreased by applying a negative-potential substrate bias particularly in an NMOS transistor. Specifically, the value of $B_{VT}$ when $V_{BS}$ is −2 V, is smaller than that of $B_{VT}$ when $V_{BS}$ is 0 V. This means decreasing variations in threshold voltage $V_T$ by applying a negative voltage to the substrate.

If a substrate bias voltage is applied to a transistor as in the comparative example, the width of a depletion layer formed in a channel region by gate potential extends toward the inside of the substrate, thus averaging variations in location and number of impurities in the depletion layer and averaging variations in electric field close to the channel. As a result, it is considered that the variations in threshold voltage $V_T$ of the transistor is decreased.

In the foregoing embodiment, therefore, a negative voltage "VNEG" is applied to the substrate when the clamp transistor of the first embodiment described above is operated.

Consequently, the variations in threshold voltage $V_T$ of the clamp transistor can be inhibited more than those in the first embodiment.

<3> Third Embodiment

A third embodiment will be described with reference to FIGS. 11-14. In the third embodiment, the configuration of the foregoing clamp unit is modified. The basic configuration and basic operation of a storage device according to the third embodiment are the same as those of the storage device according to the first embodiment described above. Accordingly, a description of the foregoing matters of the first embodiment is omitted, as is a description of matters that can easily be inferred from the first embodiment described above.

<3-1> Configuration of Sense Amplifier

<3-1-1> Circuit Arrangement of Clamp Unit

A clamp unit 122 will be described with reference to FIG. 11. The source of a PMOS transistor 122a (clamp transistor) is connected to a global source line GSL, the drain thereof is grounded and the gate thereof is supplied with a clamp signal "VCLAMP." The PMOS transistor 122a serves as a transistor through which cell current flows.

One end of a reference circuit 122b is connected to a reference global bit line RGBL and the other end thereof is connected to a node N12. The reference circuit 122b includes a resistive element, for example.

The source of a PMOS transistor 122c (clamp transistor) is connected to the node N12, the drain thereof is grounded and the gate thereof is connected to a node N13 to which a constant-current source 122f is connected.

One end of a reference circuit 122d is connected to a node N14 to which a power supply voltage "VDD" is applied, and the other end thereof is connected to a node N15. The reference circuit 122d includes a resistive element, for example.

The drain and gate of a PMOS transistor 122e are connected to the node N13 and the source thereof is connected to the node N15.

One end of the constant-current source 122f is connected to the node N13 and the other end thereof is grounded. The PMOS transistors 122c and 122e and the constant-current source 122f constitute a current mirror circuit.

The clamp unit 122 generates a reference voltage (Vref) from a constant-voltage source including a constant-current source, a transistor and a resistive element and applies it to the gate of the PMOS transistor 122c. It is thus possible to generate reference current IREF having a fixed value. The PMOS transistor 122c serves as a transistor through which cell current flows.

When data is read out of a memory cell, the substrate bias voltages of the PMOS transistors 122a, 122c and 122e are fixed to "VDD."

<3-1-2> Configuration Example 1 of Clamp Transistor

A configuration example 1 of the PMOS transistors 122a, 122c and 122e (clamp transistor) will be described with reference to FIG. 12.

Figure 12:
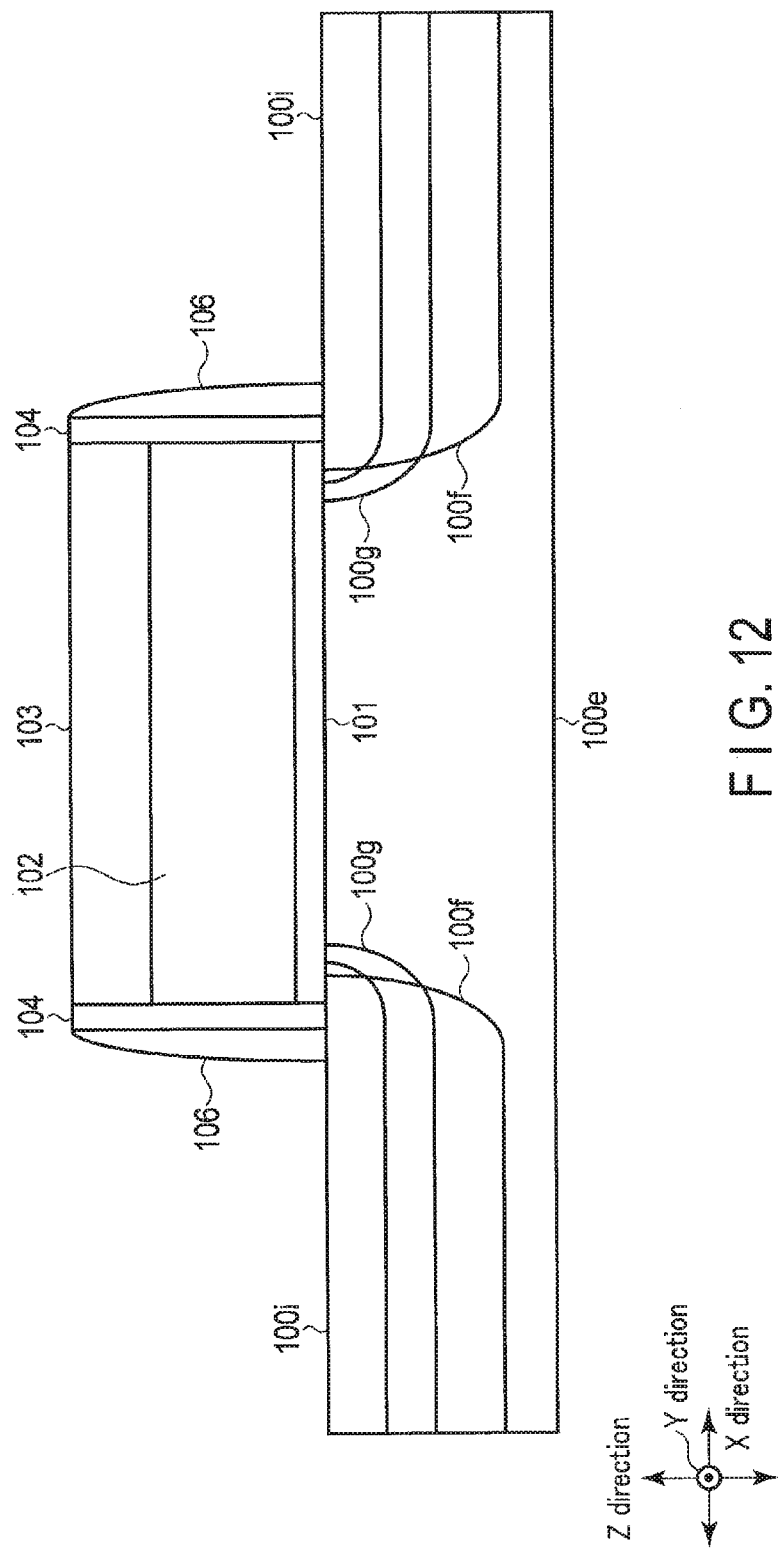
FIG. 12 is a cross-sectional view of a clamp transistor of the semiconductor memory device according to the third embodiment.

As shown in FIG. 12, a gate structure is provided on a semiconductor substrate 100e, and sidewall films 104 are provided along the Y direction of the gate structure.

Furthermore, a sidewall film 106 (formed of, e.g., $SiO_2$) whose thickness (thickness along the X direction) is about 100 to 300 Angstrom is provided on the sidewall of each of the sidewall films 104 along the Y direction.

As shown in FIG. 12, in the clamp transistor, an impurity diffusion region 100f (e.g., B, 1E13 to 1E14 [$1/cm^2$], 7-15 [KeV]) is provided in the surface region of the semiconductor substrate 100e. An impurity diffusion region 100g (e.g., phosphorus (P), 1E13 [$1/cm^2$], 5-15 [KeV]) is provided in the surface region of the impurity diffusion region 100f of the semiconductor substrate 100e. Moreover, an impurity diffusion region 100i (e.g., BF2, 2E15 [$1/cm^2$], 5-15 [KeV]) is provided in the surface region of the impurity diffusion region 100g of the semiconductor substrate 100. The impurity diffusion region 100f and impurity diffusion region 100i serve as a source or a drain of the clamp transistor.

Though not shown, a contact to be connected to other wiring is provided on the semiconductor substrate and on the impurity diffusion region 100i.

The impurity diffusion region 100i can be referred to as an S/D region.

The impurity diffusion region 100g and each of the impurity diffusion regions 100f and 100i have only to be formed of impurities of conductivity types opposite to each other.

The impurity diffusion region 100g and impurity diffusion region 100i extend off the impurity diffusion region 100f toward the direction of the channel region. The impurity diffusion region 100f, impurity diffusion region 100g and impurity diffusion region 100i are partly located in the lower part of the gate structure, or the impurity diffusion region 100f, impurity diffusion region 100g and impurity diffusion region 100i are located inwardly from an end portion of the gate structure. In the configuration example 2 of the clamp transistor, the sidewall film 106 is thinner than the sidewall film 105 and thus the impurity diffusion region 100i is formed close to the impurity diffusion region 100g.

<3-1-3> Configuration Example 2 of Clamp Transistor

A configuration example 2 of the PMOS transistors 122a, 122c and 122e (clamp transistor) will be described with reference to FIG. 13.

As shown in FIG. 13, in the clamp transistor, a p-type impurity diffusion region 100f (e.g., B, 1E13 to 1E14 [1/cm$^2$], 7-15 [KeV]) is provided in the surface region of the n-type semiconductor substrate 100e. An n-type impurity diffusion region 100g (e.g., phosphorus (P), 1E13 [1/cm$^2$], 5-15 [KeV]) is provided in the surface region of the impurity diffusion region 100f of the semiconductor substrate 100. Moreover, a p-type impurity diffusion region 100h (e.g., BF2, 2E15 [(1/cm$^2$], 5-15 [KeV]) is provided in the surface region of the impurity diffusion region 100g of the semiconductor substrate 100. The impurity diffusion region 100f and impurity diffusion region 100h serve as a source or a drain of the clamp transistor.

Though not shown, a contact to be connected to other wiring is provided on the semiconductor substrate and on the impurity diffusion region 100h.

The impurity diffusion region 100f can be referred to as a source/drain (S/D) region of a lightly doped drain (LDD) type. The impurity diffusion region 100g can be referred to as a halo region. The impurity diffusion region 100h can be referred to as an S/D region.

The impurity diffusion region 100g and each of the impurity diffusion regions 100f and 100h have only to be formed of impurities of conductivity types opposite to each other.

The impurity diffusion region 100g extends off the impurity diffusion region 100f toward the direction of the channel region. The impurity diffusion region 100f and impurity diffusion region 100g are partly located in the lower part of the gate structure. The impurity diffusion region 100h is not located at least in the lower part of the gate structure. For example, the impurity diffusion region 100h is provided below the sidewall film 105, or the impurity diffusion region 100g is located inwardly from an end portion of the gate structure, and the impurity diffusion region 100h is located outside the end portion of the gate structure.

In other words, the end portion of the impurity diffusion region 100h is offset from that of the impurity diffusion region 100f.

In the foregoing first embodiment, when the impurity diffusion region 100d is close to the impurity diffusion region 100b, TED of B is caused close to the channel region.

However, it is considered that TED of P is difficult to cause by the Si interstitial generation. In other words, when the impurity diffusion region 100i is formed close to the impurity diffusion region 100g, TED of P is difficult to cause close to the channel region.

Therefore, the profile of an impurity diffusion layer as described above can be applied to the PMOS transistors.

<3-2> Operational Advantages

According to the foregoing embodiment, a PMOS transistor is employed in the clamp unit.

As illustrated in FIG. 17 of non-patent document 1, when the impurities of a channel are P, or when a PMOS transistor is employed, it is seen that $B_{VT}$ as an index of variations in threshold voltage $V_T$ of the transistor is about 1.5 and the substrate bias voltage dependence is low.

It is considered that the above is caused by the facts that the PMOS transistor differs in the channel impurity profile from the NMOS transistor using B as channel impurities (the impurity concentration distribution is flatter in the depth direction) and TED of P is smaller than TED of B because of damage from ion implantation.

In the second embodiment, the amount of current of the NMOS transistor (clamp transistor) and the amount of current of the PMOS transistor (clamp transistor) have to be the same to carry out the same operation as in the first and second embodiments.

It is known that the current driving force of a PMOS transistor is about ⅔ times as great as that of an NMOS transistor depending on a difference in carrier mobility.

It is thus necessary to decrease the gate length L of the PMOS transistor or increase the gate width W thereof in order to correct the current driving force of the PMOS transistor. However, it is not favorable to increase the gate width W because it increases the area of elements.

However, as the gate length L decreases with the gate width W fixed, the area of channels also decreases. This increases variations in threshold voltage of a transistor. Hereinafter, a relationship between the area of a gate and the variations will be described.

Assuming that the NMOS and PMOS transistors have the same absolute value (|VT|) of threshold voltage VT in FIG. 17 of non-patent document 1, $B_{VT}$ of the NMOS transistor and that of the PMOS transistor are 2.3 and 1.5, respectively. In other words, it is assumed that the variations in threshold voltage $V_T$ of the PMOS transistor are about ⅔ times as large as the variations in threshold voltage $V_T$ of the NMOS transistor.

Assuming that the ratio of the current driving force of the PMOS transistor to the current driving force of the NMOS transistor is 2:3, the gate length L of the PMOS transistor needs to be ⅔ times as great as the gate length of the NMOS transistor. If it is converted into 1/sqrt (LW), the former will become about 1.2 times as great as the latter.

Figure 14:
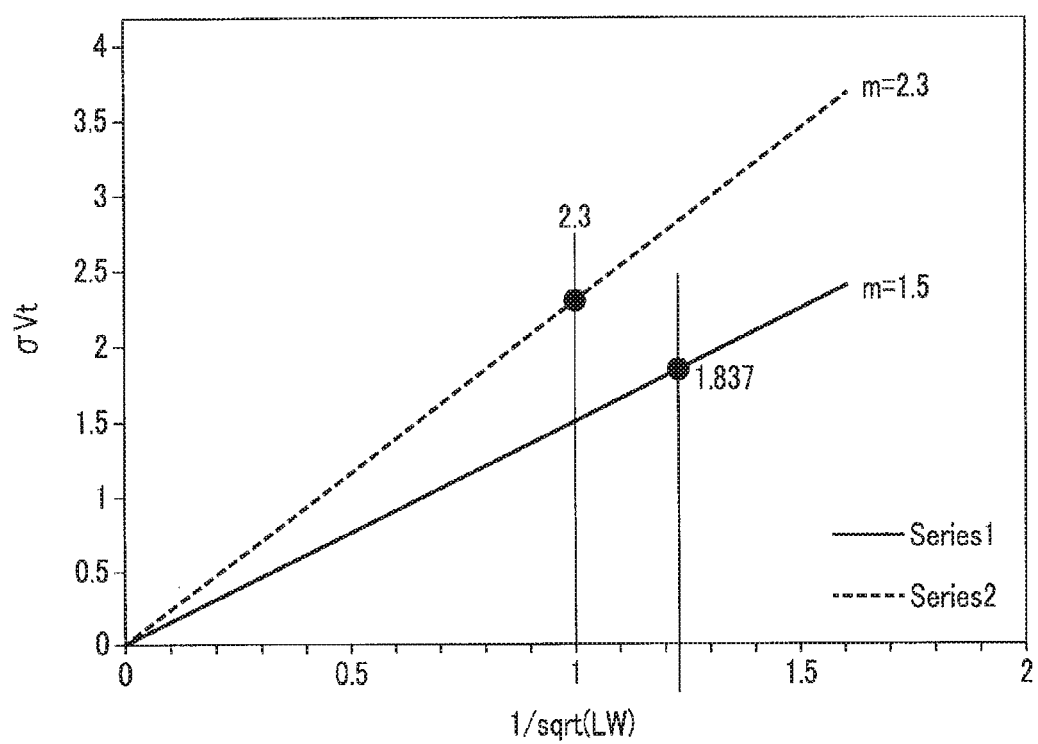
FIG. 14 is a graph showing a relationship between variations in threshold voltage of the transistor and 1/sqrt (LW).

FIG. 14 shows a relationship between sigma $V_T$ and 1/sqrt (LW). In FIG. 14, a dot is added to 1/sqrt (LW) of the PMOS transistor capable of achieving the same drain current as in the case where 1/sqrt (LW) of the NMOS transistor is 1.0.

It is seen from FIG. 14 that the ratio of the NMOS transistor to the PMOS transistor is 2.0 to 1.83 at sigma $V_T$ and when the PMOS transistor is adopted, the variations are improved a little less than 20%. In other words, it is found advantageous to adopt the PMOS transistor even though the gate length is decreased. If, therefore, the sense amplifier of the third embodiment is adopted, it is possible to reduce the size of the clamp transistor and inhibit the variations in threshold voltage $V_T$ of the transistor more than the first and second embodiments. As a result, the performance of the sense amplifier can be improved further.

MODIFICATION, ETC

In the foregoing embodiments, the MRAM using a magnetoresistive effect element has been described as a semiconductor memory device. The semiconductor memory device is not limited to the MRAM. Various types of semiconductor memory device can be applied, irrespective of whether it is a volatile memory or a nonvolatile memory. A resistance change memory of the same type as that of the MRAM, such as a ferroelectric random access memory (FeRAM), a phase change random access memory (PCRAM) and a resistive random access memory (ReRAM) can be applied.

In the foregoing embodiments, the paired bit lines are referred to as bit lines BL and source lines SL for convenience sake; however, the paired bit lines are not limited to the bit lines BL or source lines SL but can also be referred to as first bit lines, second bit lines and the like.

Furthermore, in the foregoing embodiments, the global bit lines GBL, bit lines BL, global source lines GSL and source lines SL can simply be referred to as bit lines. In the foregoing embodiments, the global source lines GSL and source lines SL can simply be referred to as source lines.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell;
a bit line connected to the memory cell;
a sense circuit which senses data of the memory cell based on first current and second current that flows through the memory cell;
a first transistor of a first conductivity type, which is connected to the bit line and through which the second current flows; and
a second transistor of the first conductivity type, through which the first current flows,
wherein the first transistor and the second transistor include:
a semiconductor substrate;
a gate structure provided on the semiconductor substrate;
a first conductive region of the first conductivity type provided in the semiconductor substrate inwardly from an end portion of the gate structure;
a second conductive region of a second conductivity type different from the first conductivity type, which is provided in the semiconductor substrate more inwardly from the end portion of the gate structure than the first conductive region; and
a third conductive region of the first conductivity type provided in the semiconductor substrate and outside the end portion of the gate structure.

2. The semiconductor memory device of claim 1, wherein:
a negative voltage is applied to the semiconductor substrate of the first transistor when the second current is caused to flow; and
a negative voltage is applied to the semiconductor substrate of the second transistor when the first current is caused to flow.

3. The semiconductor memory device of claim 1, further comprising:
a first reference circuit which is connected to the second transistor and through which the first current flows;
a constant-current source from which a voltage is applied to a gate of the second transistor;
a third transistor of the first conductivity type to one end and a gate of which the constant-current source is connected; and
a second reference circuit connected to the other end of the third transistor.

4. The semiconductor memory device of claim 1, wherein:
the third conductive region is provided close to a surface of the semiconductor substrate;
the second conductive region is located in the semiconductor substrate more deeply than the third conductive region; and
the first conductive region is located in the semiconductor substrate more deeply than the second conductive region.

5. The semiconductor memory device of claim 1, wherein the third conductive region has an impurity concentration which is higher than an impurity concentration of the first conductive region.

6. The semiconductor memory device of claim 1, wherein:
the first conductivity type is an N type; and
the second conductivity type is a P type.

7. The semiconductor memory device of claim 1, wherein the memory cell includes a resistance change element in which data is allowed to be held.

8. The semiconductor memory device of claim 1, wherein the memory cell is one of a magnetoresistive random access memory (MRAM), a ferroelectric random access memory (FeRAM), a phase change random access memory (PCRAM) and a resistive random access memory (ReRAM).

9. A semiconductor memory device comprising:
a memory cell;
a bit line connected to the memory cell;
a source line connected to the memory cell;
a sense circuit connected to the bit line to sense data of the memory cell based on first current and second current that flows through the memory cell;
a first transistor of a first conductivity type, which is connected to the source line and through which the second current flows; and
a second transistor of the first conductivity type, through which the first current flows,
wherein the first transistor and the second transistor include:
a semiconductor substrate;
a gate structure provided on the semiconductor substrate;
a first conductive region of the first conductivity type provided in the semiconductor substrate inwardly from an end portion of the gate structure;
a second conductive region of a second conductivity type different from the first conductivity type, which is provided in the semiconductor substrate more inwardly from the end portion of the gate structure rather than the first conductive region; and
a third conductive region of the first conductivity type provided in the semiconductor substrate outwardly from the end portion of the gate structure.

10. The semiconductor memory device of claim 9, wherein:
- a positive voltage is applied to the semiconductor substrate of the first transistor when the second current is caused to flow; and
- a positive voltage is applied to the semiconductor substrate of the second transistor when the first current is caused to flow.

11. The semiconductor memory device of claim 10, further comprising:
- a first reference circuit one end of which is connected to the sense circuit and the other end of which is connected to the second transistor and through which the second current flows;
- a constant-current source from which a voltage is applied to a gate of the second transistor;
- a third transistor of the first conductivity type to one end and a gate of which the constant-current source is connected; and
- a second reference circuit to one end of which a power supply voltage is applied and the other end of which is connected to the other end of the third transistor.

12. The semiconductor memory device of claim 10, wherein:
- the third conductive region is provided close to a surface of the semiconductor substrate;
- the second conductive region is located in the semiconductor substrate more deeply than the third conductive region; and
- the first conductive region is located in the semiconductor substrate more deeply than the second conductive region.

13. The semiconductor memory device of claim 10, wherein the third conductive region has an impurity concentration which is higher than an impurity concentration of the first conductive region.

14. The semiconductor memory device of claim 10, wherein:
- the first conductivity type is a P type; and
- the second conductivity type is an N type.

15. A semiconductor memory device comprising:
- a memory cell;
- a bit line connected to the memory cell;
- a source line connected to the memory cell;
- a sense circuit connected to the bit line to sense data of the memory cell based on first current and second current that flows through the memory cell;
- a first transistor of a first conductivity type, which is connected to the source line and through which the second current flows; and
- a second transistor of the first conductivity type, through which the first current flows,
- wherein the first transistor and the second transistor include:
  - a semiconductor substrate;
  - a gate structure provided on the semiconductor substrate;
  - a first conductive region of the first conductivity type provided in the semiconductor substrate inwardly from an end portion of the gate structure;
  - a third conductive region of the first conductivity type provided in the semiconductor substrate more inwardly from the end portion of the gate structure than the first conductive region; and
  - a second conductive region of a second conductivity type different from the first conductivity type, which is provided in the semiconductor substrate more inwardly from the end portion of the gate structure than the third conductive region.

16. The semiconductor memory device of claim 15, wherein:
- a positive voltage is applied to the semiconductor substrate of the first transistor when the second current is caused to flow; and
- a positive voltage is applied to the semiconductor substrate of the second transistor when the first current is caused to flow.

17. The semiconductor memory device of claim 15, further comprising:
- a first reference circuit one end of which is connected to the sense circuit and the other end of which is connected to the second transistor and through which the first current flows;
- a constant-current source from which a voltage is applied to a gate of the second transistor;
- a third transistor of the first conductivity type to one end and a gate of which the constant-current source is connected; and
- a second reference circuit to one end of which a power supply voltage is applied and the other end of which is connected to the other end of the third transistor.

18. The semiconductor memory device of claim 15, wherein:
- the third conductive region is provided close to a surface of the semiconductor substrate;
- the second conductive region is located in the semiconductor substrate more deeply than the third conductive region; and
- the first conductive region is located in the semiconductor substrate more deeply than the second conductive region.

19. The semiconductor memory device of claim 15, wherein the third conductive region has an impurity concentration which is higher than an impurity concentration of the first conductive region.

20. The semiconductor memory device of claim 15, wherein:
- the first conductivity type is a P type; and
- the second conductivity type is an N type.

* * * * *